United States Patent [19]
Yoon et al.

[11] Patent Number: 6,133,745
[45] Date of Patent: Oct. 17, 2000

[54] SOCKET TYPE MODULE TEST APPARATUS AND SOCKET FOR THE SAME

[75] Inventors: Jae Moon Yoon; Bae Ki Lee; Sang Chul Yoon, all of Asan, Rep. of Korea

[73] Assignee: Samsung Electronics Co., Ltd., Rep. of Korea

[21] Appl. No.: 09/176,053

[22] Filed: Oct. 20, 1998

[30] Foreign Application Priority Data

Nov. 13, 1997 [KR] Rep. of Korea ................. 97-59876

[51] Int. Cl.⁷ .................................................. G01R 31/02
[52] U.S. Cl. ................... 324/755; 324/158.1; 324/73.1; 324/758; 361/801
[58] Field of Search .................................. 324/755, 758, 324/73.1, 158.1; 361/801

[56] References Cited

U.S. PATENT DOCUMENTS 3,716,786  2/1973  Gearin .............................. 324/158.1
5,307,011  4/1994  Tani ................................. 324/158.1
5,889,656  3/1999  Yin ....................................... 361/801

FOREIGN PATENT DOCUMENTS 0795936  9/1997  European Pat. Off. ...... H01R 13/719

Primary Examiner—Safet Metjahic
Assistant Examiner—Jimmy Nguyen
Attorney, Agent, or Firm—Skjerven Morrill MacPherson LLP; David T. Millers

[57] ABSTRACT

A socket type module test apparatus can eliminate the problems which are related to the unstable contact between pins and a module in a pin type module test apparatus. At the same time, the socket type module apparatus increases the module test productivity, in comparison with a manual module test using sockets. An embodiment of the present invention comprises a transportation unit for transporting modules; a test unit where the modules are loaded by the transportation unit and tested; and a main control unit for supervising a test procedure by providing test signals to the modules and sorting the module according to test result.

24 Claims, 22 Drawing Sheets

SOCKET TYPE MODULE TEST APPARATUS AND SOCKET FOR THE SAME

BACKGROUND OF THE INVENTION

1. Field of the Invention

The present invention relates to a module test apparatus. Particularly, this invention relates to a socket type module test apparatus including a transportation unit which automatically loads and unloads modules for testing and provides stable mechanical and electrical contact between modules and test sockets during test. This invention also relates to a socket used for the module test apparatus.

2. Description of the Related Arts

A number of semiconductor devices are often combined on a single substrate and used as a module to improve the performance of the system that uses the semiconductor devices. For example, memory integrated circuit chips mounted on a printed circuit board form a memory module. A module generally comprises a number of semiconductor devices and a substrate. The semiconductor devices are mounted on one side or both sides of the substrate and are electrically interconnected by wiring patterns formed in the substrate. The substrate typically contains a number of external terminals extending from the wiring patterns along an edge of the substrate.

Modules are tested to verify their characteristics. Two types of module tests are generally used. One is a manual test where a module is manually loaded to and unloaded from a socket. The other is an automatic test which uses an automatic module handling unit and test pins.

In the manual test, an operator inserts modules by hand into sockets that are connected to a control unit and tests the modules by using the control unit. The control unit generates test signals, sends the signals to the modules, and evaluates the characteristics of the modules. After finishing the test, the operator removes the modules and classifies the modules according to the test results. This manual test method offers a stable contact mechanism between sockets and external terminals of modules. However, the manual test method also has several disadvantages. Among them are low test productivity due to the manual handling and the risk of human error in classifying the modules.

In contrast, the automatic test method increases module test productivity and reduces the possibility of human error. In this method, test signals are transferred to modules via test pins, so-called Pogo pins, not via a socket. An automatic module tester comprises a pin block which is somewhat similar to a socket, and the pin block has a number of test pins installed at positions where the pins contact external terminals of modules. Automatic testers use a test pin block instead of a socket because the test pin block allows easy and no-force insertion of modules, whereas the socket requires external force for insertion of modules.

A module tester using test pins will be described with reference to FIGS. 1 to 5. Test pin type module tester 100 comprises a main control unit 90, a test unit 10, and a transportation unit 20. Tester 100 further comprises a supply tray 32 which contains modules to be tested, an output tray 34 which collects the modules that passed a module test, and a collection bin 36 which collects modules that failed to pass the test.

Main control unit 90 controls test unit 10 and transportation unit 20. Main control unit 90 tests module 40 by generating and sending test signals to module 40 through test pins 14 which contact external terminals 41, judges whether module 40 passed the test, and does the loading and unloading of module 40 at pin block 12 by using transportation unit 20 (FIG. 2). In FIG. 1, reference numeral 92 refers to transmission lines through which signals are transmitted from main control unit 90 to test unit 10 and transportation unit 20.

Test unit 10 comprises a base block 16 which is composed of two pin blocks 12 which have plural test pins 14 for contacting external terminals 41 of module 40. As depicted in FIG. 4, which is a sectional view taken along the line 4—4 in FIG. 3, a test pin 14 is composed of a contact pin 19, a spring 17 and a sheath 13, and thereby, contact pin 19 can move elastically in and out of sheath 13. A tip 19a of contact pin 19 which contacts external terminal 41 of module 40 is embossed for good contact.

Referring to FIGS. 1, 2, and 5, transportation unit 20 comprises a loading picker 24 for transporting the modules to be tested from supply tray 32 to pin blocks 12, and a unloading picker 26 for transporting the tested modules from pin blocks 12 to output tray 34 or collection bin 36.

The test procedure using module tester 100 will be explained referring to FIGS. 1 to 5. First, loading picker 24 picks up module 40 in supply tray 32 and transports module 40 to a position above pin block 12 (FIG. 2). Then, loading picker 24 moves downward and places module 40 between pin blocks 12, pin blocks 12 move toward each other so that test pins 14 contact external terminals 41 of module 40, and the test is carried out (FIGS. 3 and 4). After the test is finished, unloading picker 26 picks up tested module 40, and pin blocks 12 return to their original positions to release module 40 (FIG. 5). Thereafter, unloading picker 26 goes up and transports tested module 40 to output tray 34, or to collection bin 36.

The automatic test using test pin type module tester can accomplish higher test productivity than the manual test. However, a contact to external terminals of module by test pin is less stable than the contact by socket, and the unstable contact may produce noise during test. That is, the unstable contact during test may produce incorrect test results. In addition, while the lifetime of a socket is about five hundred thousand tests, the lifetime of a test pin is about fifty thousand tests.

Therefore, a module test apparatus is required to accomplish high test productivity, stable contact to module, and low maintenance cost.

SUMMARY OF THE INVENTION

The present invention provides a socket type module test apparatus comprising a transportation unit for transporting modules, a test unit, and a main unit for controlling a test procedure. The test unit comprises a socket, a test board on which the socket is placed, a base block on which the test board is placed, an alignment part, an insertion part, and a detaching part.

The detaching part is placed on the base block and releases modules after test is done. The detaching part pushes the tested module upward from the bottom of the module. This is accomplished by the movement of the components of detaching part, which includes detaching bars, fixing axles and cylinders. Preferably, the detaching bars are placed so that the detaching bars push both ends of the module.

The insertion part comprises an insertion base which is placed on the base block, a pressing cylinder which is placed on the transporting base, and a pressing bar. Each insertion part pushes down a module to insert the module into the socket. Preferably, a buffering member is attached to the side of the pressing bar touching the module during insertion and testing.

The alignment part comprises: an alignment base which is placed on the base block; a connection bar which is placed on the alignment block; and an alignment bar which is connected to the connection bar. The alignment bar has a recess at its end to contain and support the side edge of module. Preferably, the alignment bar is made of a polymeric material.

The transportation unit comprises a loading picker for loading a module to the socket and an unloading picker for unloading a module from the socket.

The present invention also provides a socket for the socket type module test apparatus. The socket comprises: a socket body; a slot to which a module is inserted; a trench formed around a mouth of the slot, the trench guiding a module to be easily inserted into the slot; insertion holes, each of which is formed at respective ends of the trench in integration with the slot for supporting a module during insertion; guide openings, each of which is formed on respective ends of the socket body for detaching bar; and a plurality of contacts placed along inner walls of the slot to make contacts to the external terminals of a module.

BRIEF DESCRIPTION OF THE DRAWINGS

The objects, features, and advantages of the present invention will be apparent to one skilled in the art in light of the following detailed description, in which.

DETAILED DESCRIPTION

An embodiment of the present invention, a socket type module test apparatus 200 (hereinafter, "module test apparatus"), will be described with reference to the attached drawings.

Figure 1:
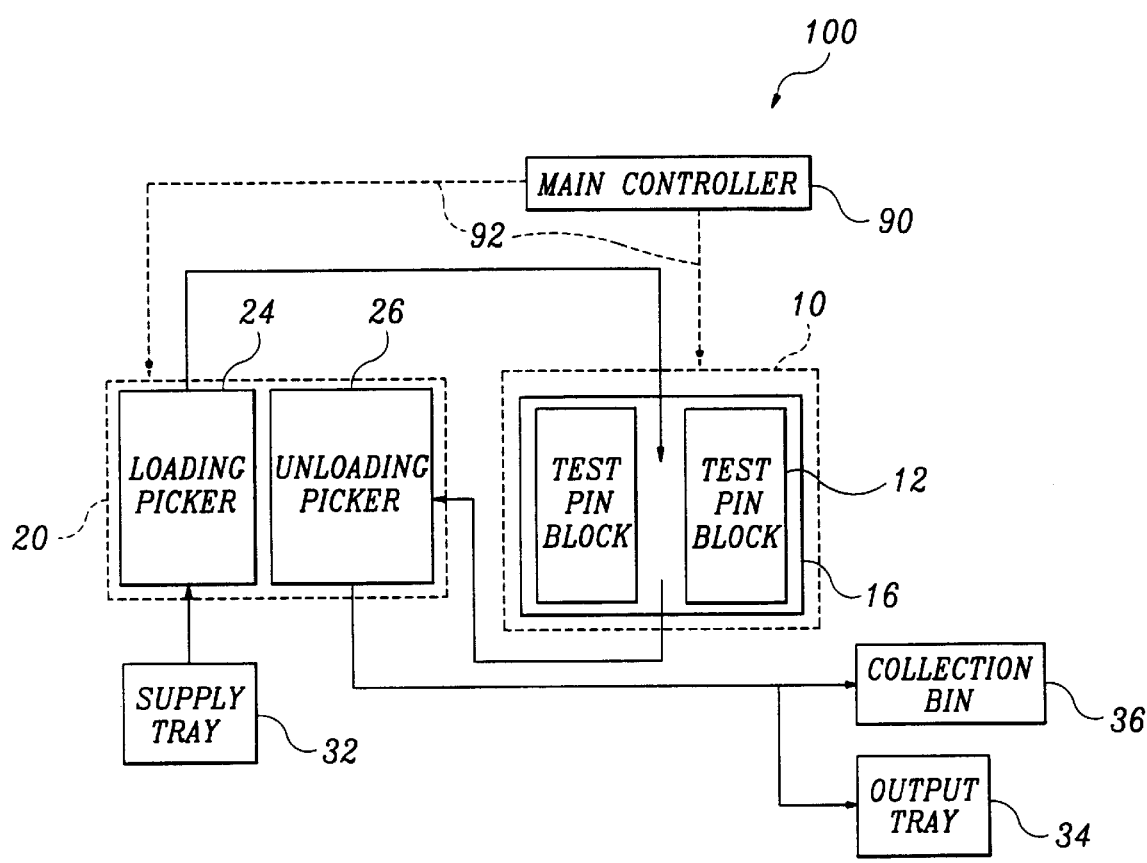
FIG. 1 is a schematic block diagram of a test pin type module test apparatus.
Figure 2:
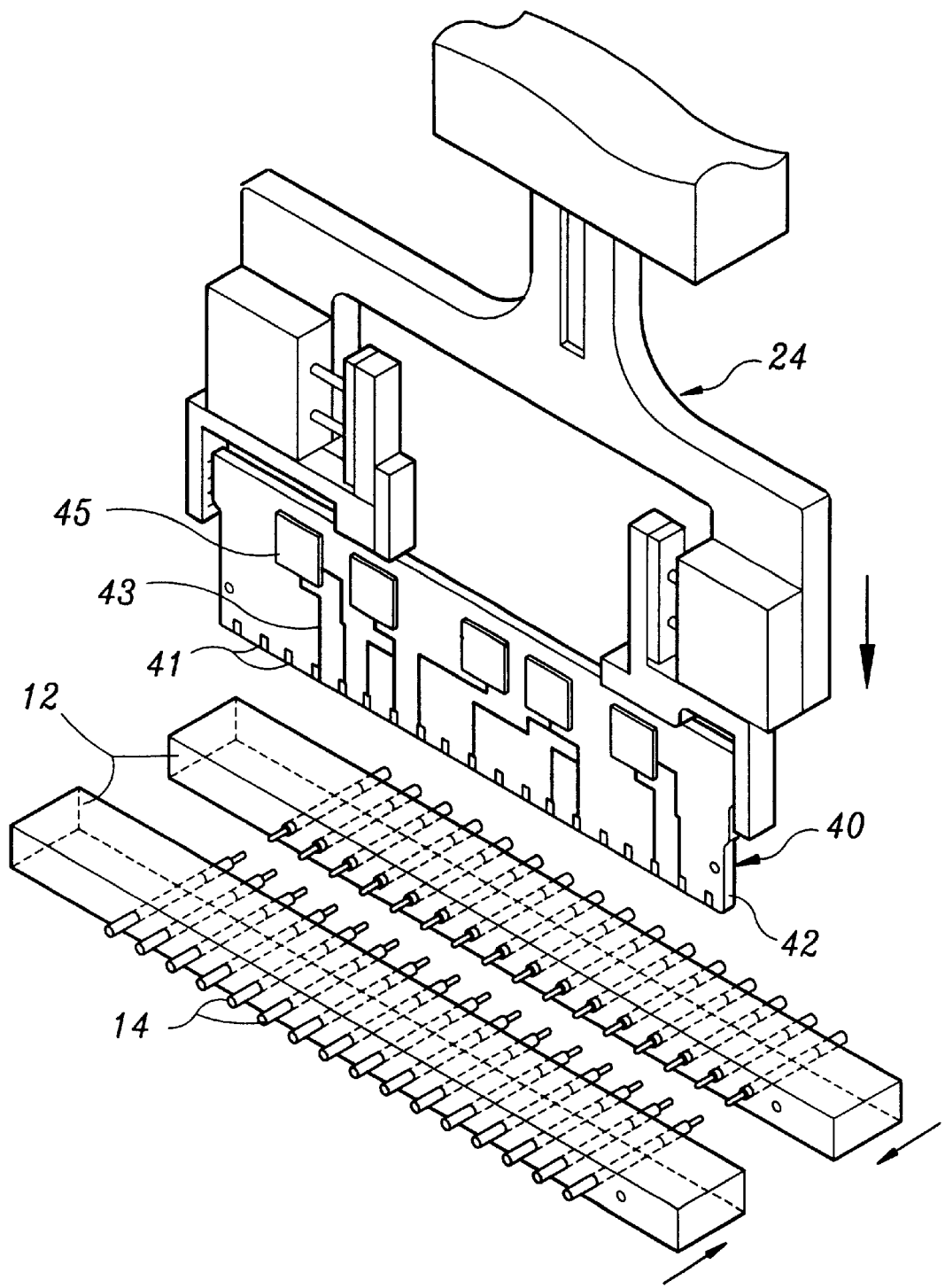
FIG. 2 is a perspective view of a module in FIG. 1 being transported to a pin block.
Figure 3:
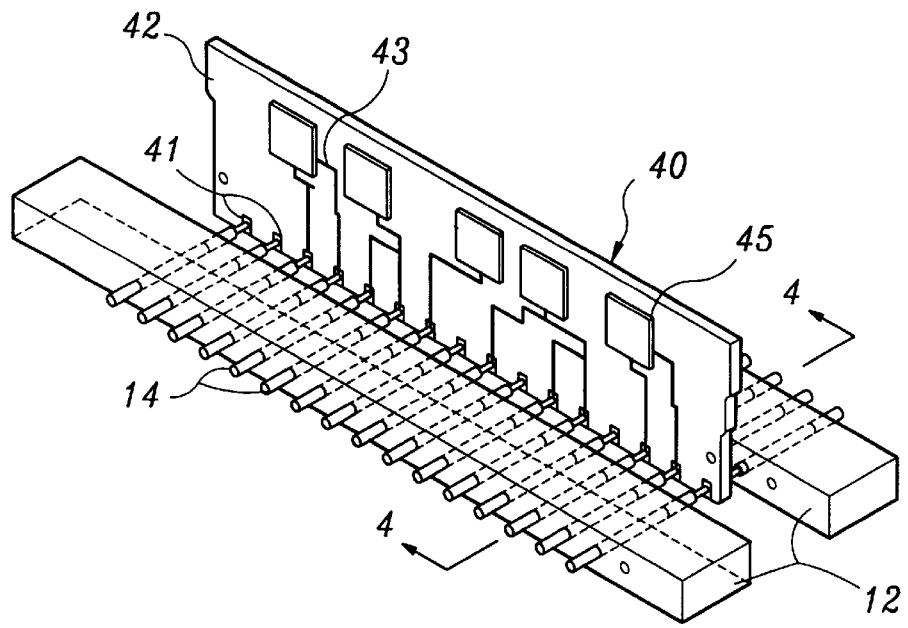
FIG. 3 is a perspective view of a module being in contact with test pins.
Figure 4:
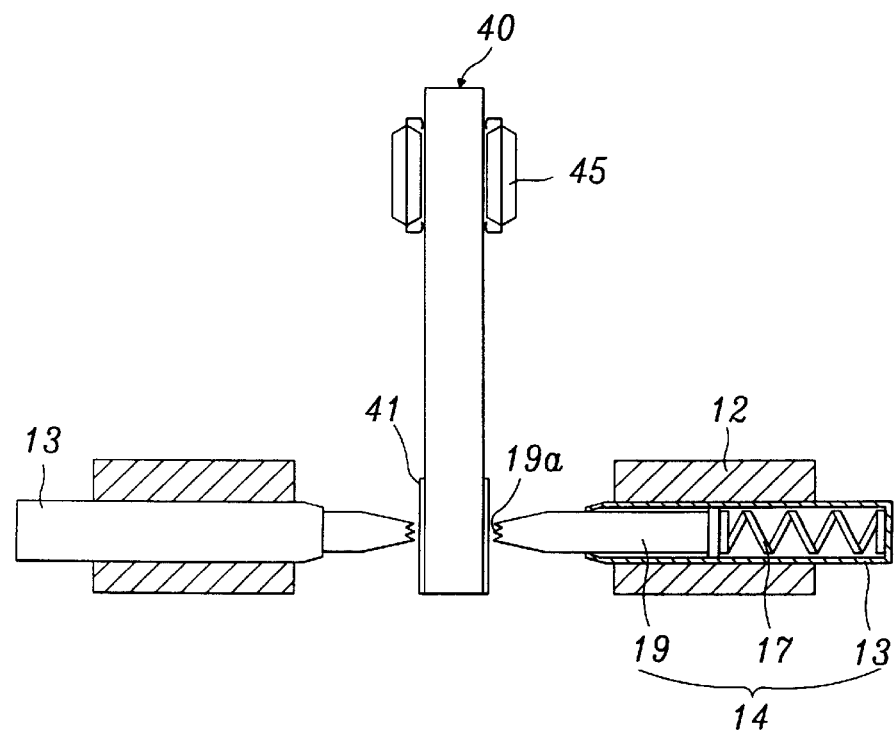
FIG. 4 is a sectional view taken along the line 4—4 in FIG. 3.
Figure 5:
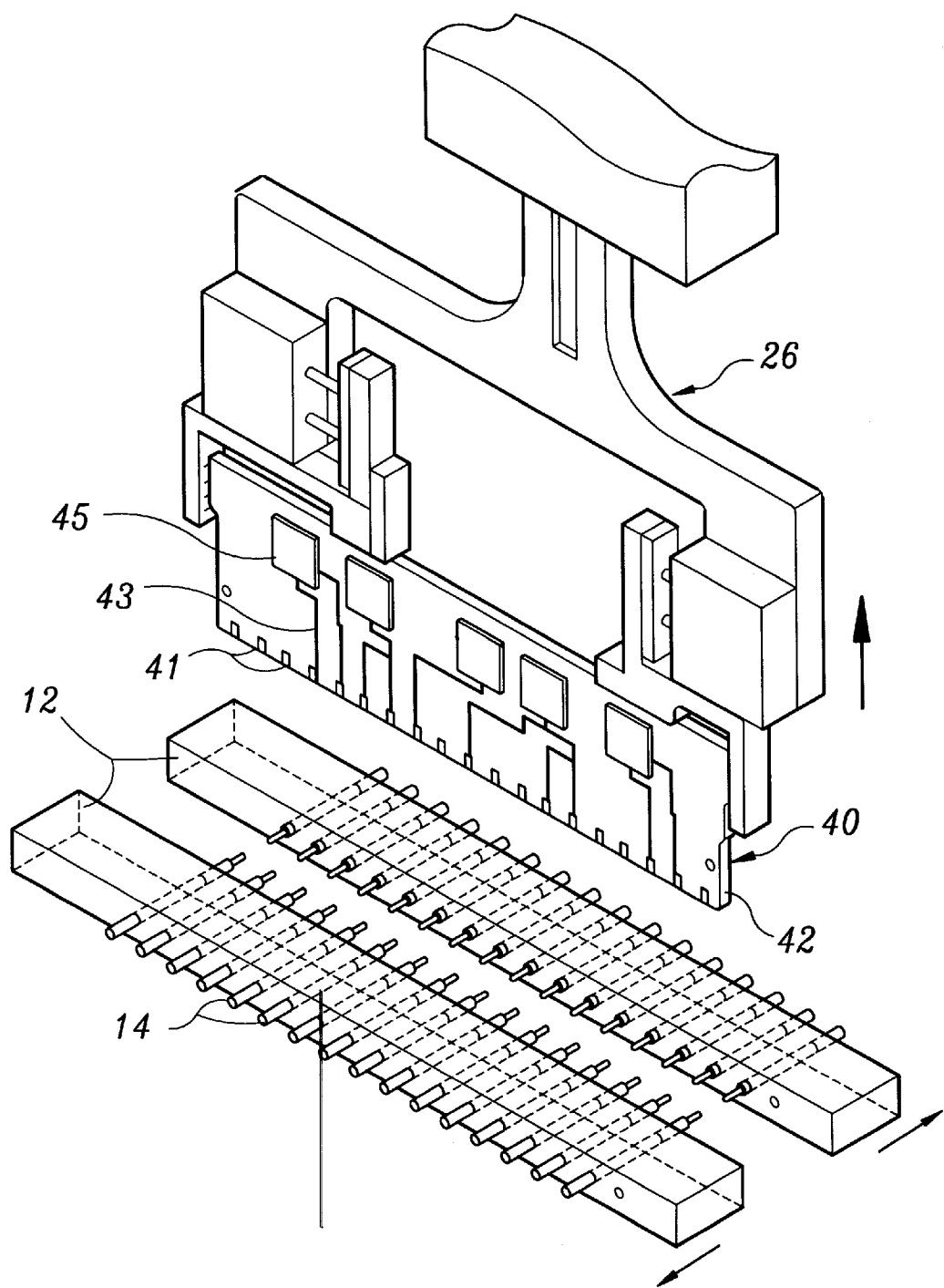
FIG. 5 is a perspective view a module being unloaded from the pin block.
Figure 6:
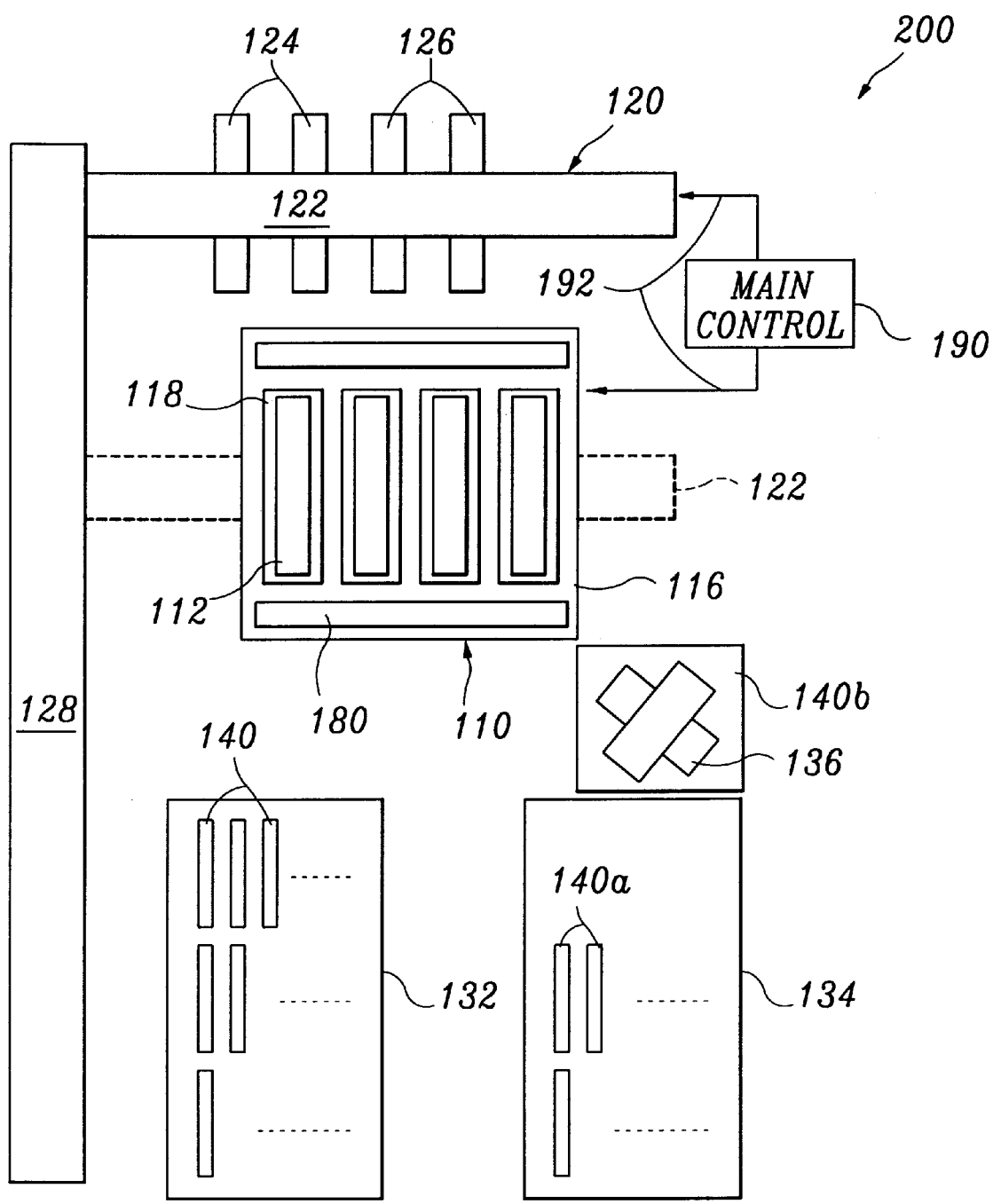
FIG. 6 is a plan view of a socket type module test apparatus according to the present invention.

With reference to FIG. 6, a socket type module test apparatus 200 generally comprises a main control unit 190, a test unit 110, a transportation unit 120, a supply tray 132 in which modules to be tested 140 are contained, an output tray 134 which collects modules 140a that passed the module test, and a collection bin 136 which collects modules 140b that failed to pass the module test.

Main control unit 190 controls the operation of test unit 110 and transportation unit 120, tests modules 140 by providing test signals to modules 140, and judges whether modules 140 passed the test. Reference numeral 192 refers to transmission lines through which signals are transmitted from main control unit 190 to test unit 110 and transportation unit 120.

Figure 7:
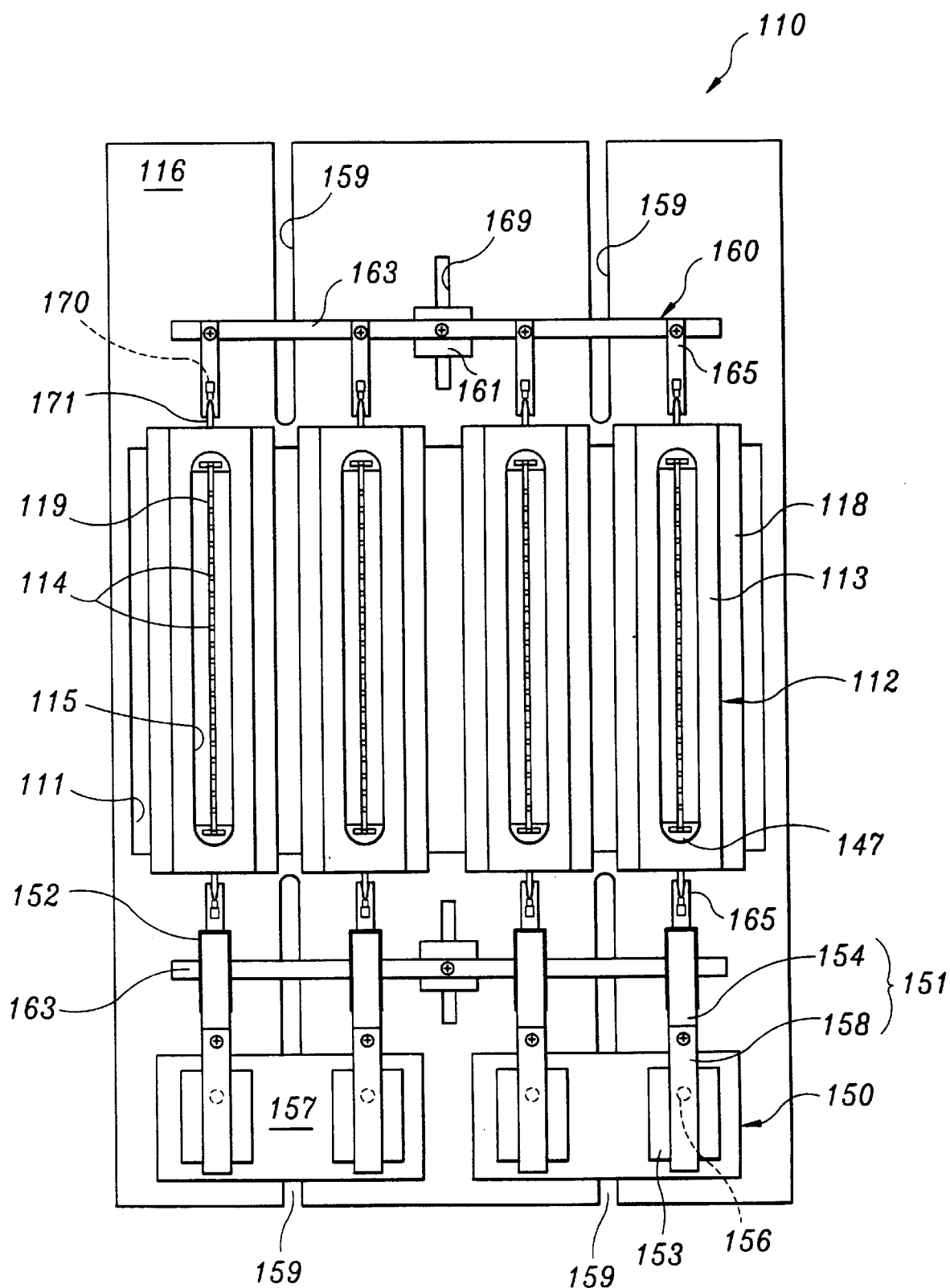
FIG. 7 is an enlarged plan view of a test unit in FIG. 6.

Modules 140 are transported from supply tray 132 to test unit 110 and are tested. Referring to FIGS. 6 and 7, test unit 110 comprises a base block 116, on which plural test boards 118 are installed, and insertion-detaching blocks 180. On test board 118, sockets 112 are mounted. Test boards 118 are positioned across an opening area 111 of base block 116. Insertion-detaching blocks 180 comprise: an alignment part 160 for aligning and supporting modules 140 transported to sockets 112; an insertion part 150 for inserting the aligned modules 140 into sockets 112; and a detaching part 170 for detaching the tested modules 140 from sockets 112.

In FIG. 6, transportation unit 120 transports modules 140 from supply tray 132 to sockets 112 of test unit 110 and transports tested modules 140 to output tray 134 or collection bin 136. Transportation unit 120 comprises: a loading picker 124 for transporting modules 140 from supply tray 132 to sockets 112; an unloading picker 126 for transporting the tested modules 140 from sockets 112 to output tray 134 or collection bin 136; and an X-axis rail 122 and a Y-axis rail 128 for guiding the movement of loading picker 124 and unloading picker 126 in test apparatus 200. Y-axis rail 128 is placed along the side of both supply tray 132 and test unit 110. X-axis rail 122 is placed perpendicular to Y-axis rail 128 and moves along the longitudinal direction of Y-axis rail 128. Loading picker 124 and unloading picker 126 are installed at regular intervals under X-axis rail 122. Loading picker 124 and unloading picker 126 move along X-axis rail 122. The transportation mechanism of transportation unit 120 can be the transportation unit that is found in the Model MR-6000 and MR-7000 Series available from Mirae Corporation in Korea.

Figure 8:
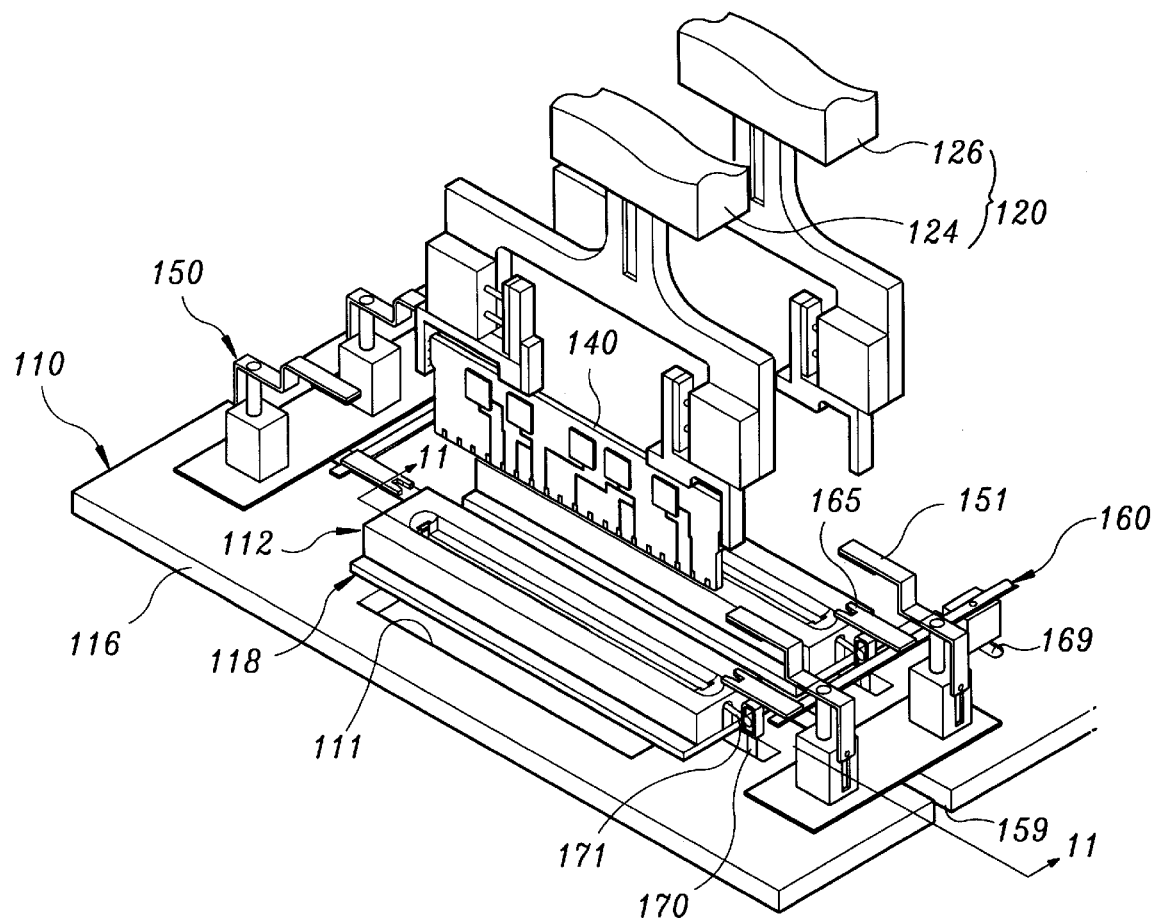
FIG. 8 is a perspective view of a module being transported to a test unit in the apparatus of FIG. 6.

In the present embodiment, two loading pickers 124 and two unloading pickers 126 are placed at the same intervals as four sockets 112 so that pickers 124 and 126 can be just above respective sockets when transporting unit 120 moves to test unit 110 to load and to unload modules 140. In FIG. 8, two of four pickers 124 and 126 are shown, where one is a loading picker 124 and the other is an unloading picker 126.

Figure 9:
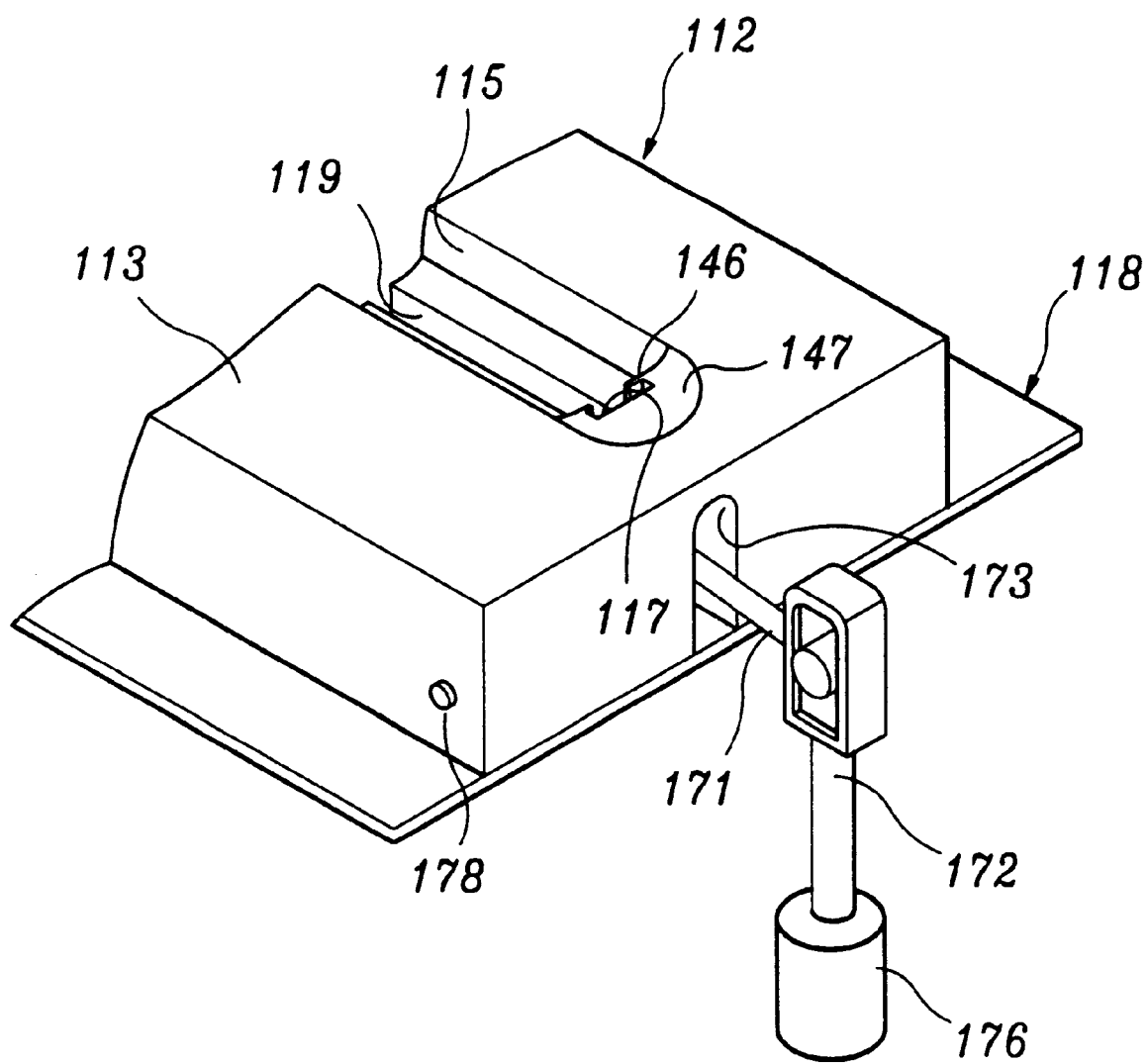
FIG. 9 is a perspective view of a detaching part and a socket in the apparatus of FIG. 6.
Figure 11:
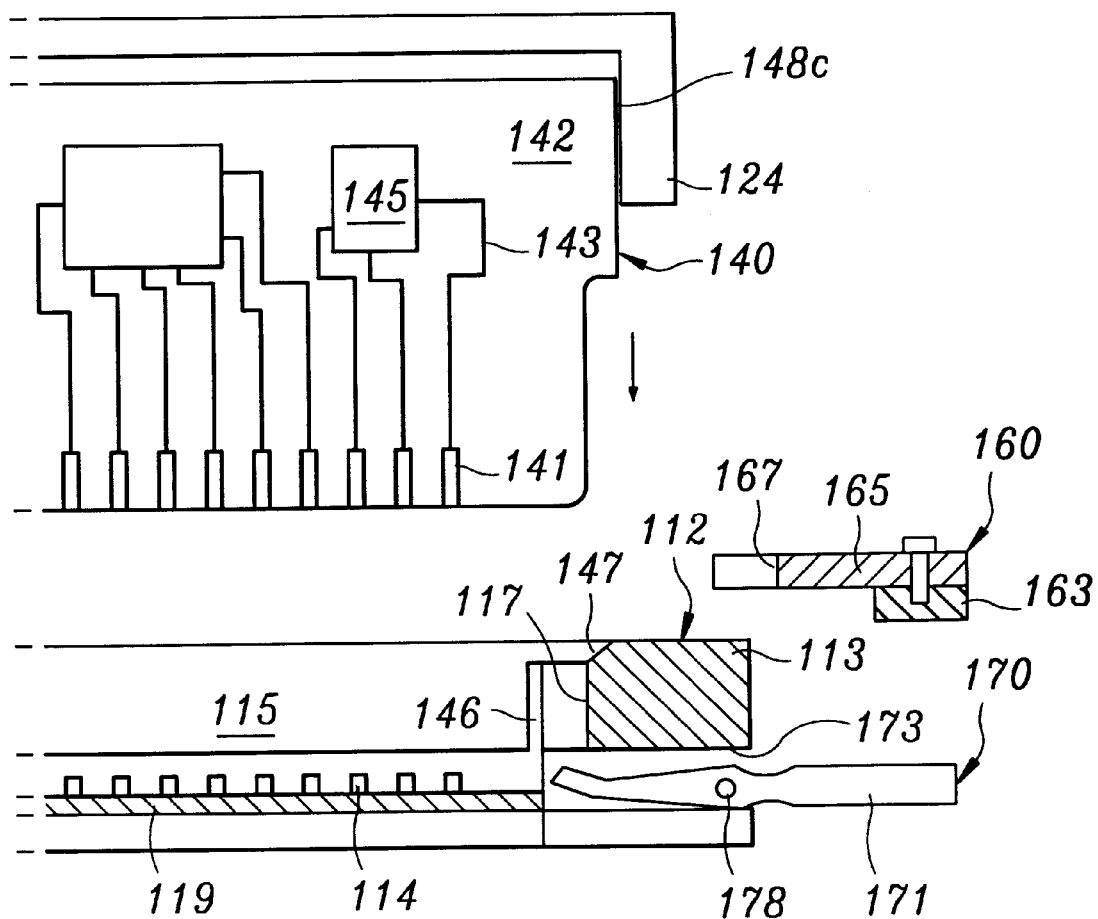
FIG. 11 is a sectional view taken along the line 11—11 in FIG. 8.

Now test unit 110 will be explained in detail with reference to FIGS. 7, 9, and 11. Socket 112 has a rectangular hexahedral body 113. At the center of socket 112, a slot 119 is formed in the longitudinal direction (FIGS. 7 and 9). Along the inner walls of slot 119, a number of socket contacts 114 are projected (FIG. 11), and these contacts 114 contact external terminals 141 of module 140 during test. As shown in FIG. 9, a trench 115 is formed around the mouth of slot 119. Trench 115, which is wider than slot 119, guides module 140 into slot 119. In FIG. 11, socket contacts 114 protrude from the inner walls of slot 119. Socket contacts 114 and slot 119 can be the same as those in the module socket of the Model JTI-TS168 available from John's Tech International Company in U.S.A.

Figure 12:
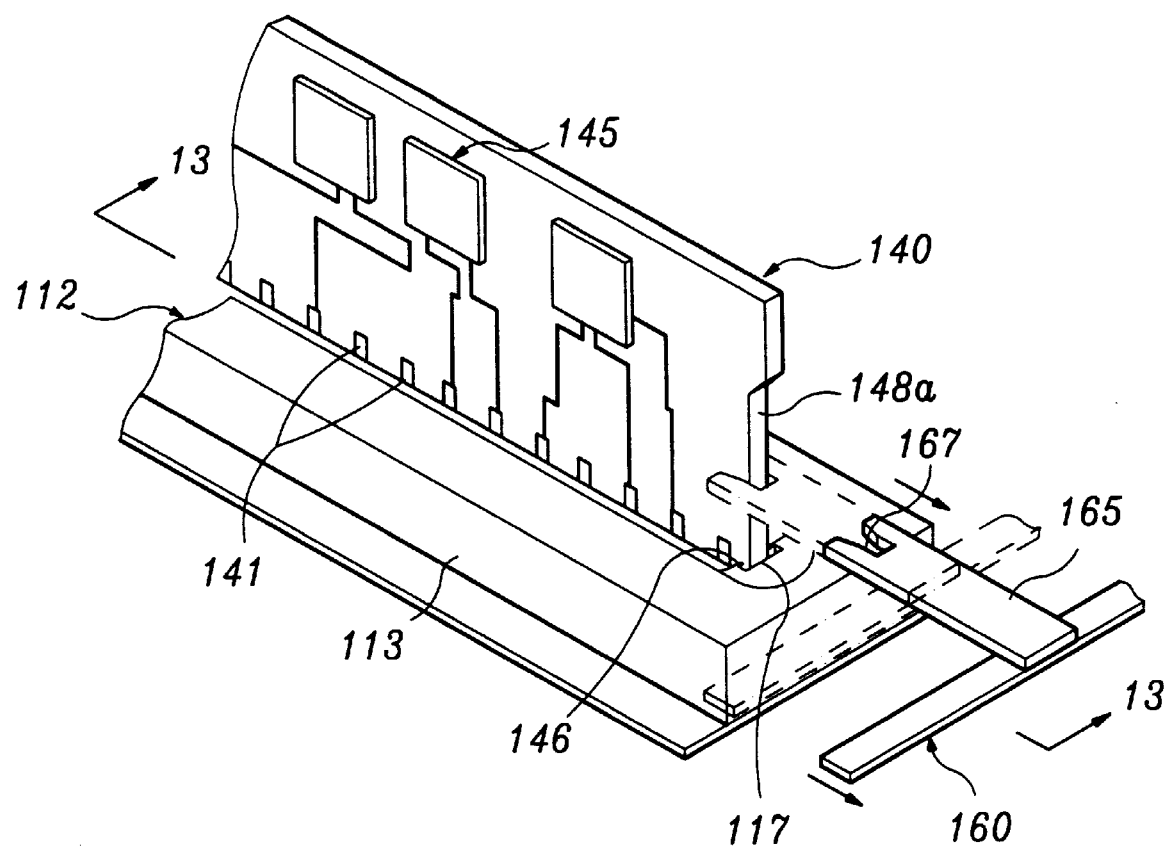
FIG. 12 is a perspective view showing how a module is aligned by an alignment unit.
Figure 13:
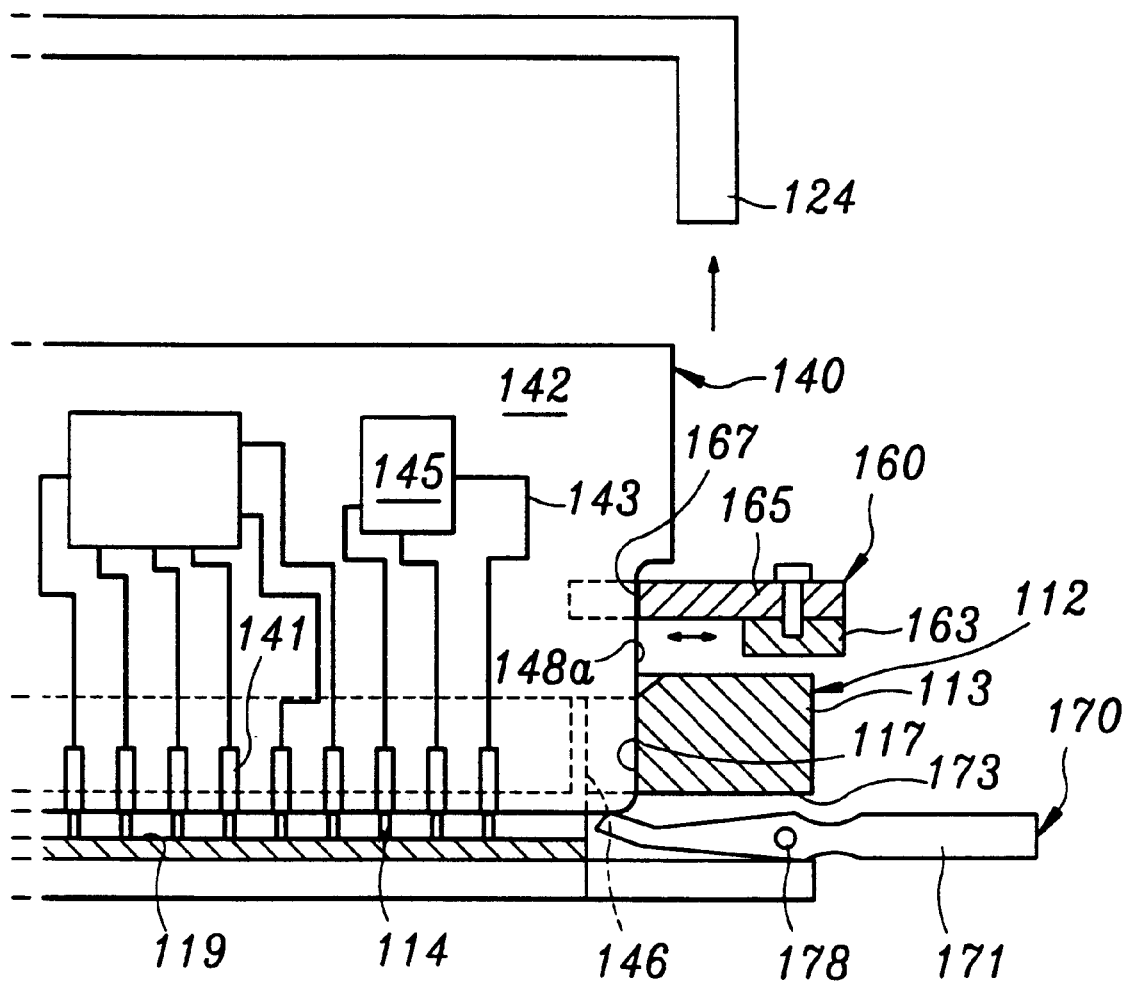
FIG. 13 is a sectional view taken along the line 13—13 in FIG. 12.

Since both ends of socket 112 are symmetrical, only one side of socket 112 will be described. Socket 112 has an insertion hole 117 at an end of slot 119. Insertion hole 117 is separated from trench 115 by a pair of vertical protrusions, which are called "supporting parts" 146, and is integrated with end portion of slot 119. Insertion hole 117 and supporting parts 146 support a side edge 148a of module 140 (FIG. 12). A guide opening 173 is formed at the transverse side of the socket body 113 and extends to slot 119. A detaching bar 171 of detaching part 170 sits inside guide opening 173. Around insertion hole 117, a guide slant 147, which is an extension of trench 115, is formed (FIG. 11) for guiding module 140 into slot 119 during module insertion. The length of slot 119 including insertion hole 117 is longer than that of module 140, and the width of slot 119 and insertion hole 117 is greater than the thickness of module 140. Since the portion of module 140 within socket 112 is smaller than that outside socket 112, an alignment part 160 provides additional support for module 140, as shown in FIG. 12.

With reference to FIGS. 9 and 11, detaching part 170 comprises detaching bar 171 sitting within guide opening 173 and extending to insertion hole 117 a vertical cylinder 176, and a detachment connection bar 172 which connects detaching bar 171 and vertical cylinder 176. Further, up-and-down movement of cylinder 176 causes detaching bar 171 to rotate around a fixing axle 178 and thereby, results in up-and-down movement of the tip of detaching bar 171.

Referring to FIGS. 7, 8, 11 and 12, alignment part 160 aligns and supports modules 140 which is loaded in sockets 112. In FIG. 7, insertion part 150 in the upper side of test unit 110 is omitted in order to depict alignment part 160 completely. Alignment part 160 comprises an alignment base 161 which is connected to a drive cylinder (not shown), an alignment bar 165 and a alignment connection bar 163 which connects alignment bars 165 to alignment base 161. The drive cylinder drives alignment base 161 to move back and forth along an alignment block opening 169 of base block 116. This movement is transferred to alignment bars 165 by alignment connection bar 163. Alignment bars 165 move back and forth toward side edge 148a of module 140. Since alignment bar 165 touches side edge 148a during insertion and testing of module 140, alignment bar 165 is preferably made of a polymeric material to minimize the damage arising when alignment bar 165 touches module 140. The end of alignment bar 165 has a recess 167 to contain side edge 148a of module 140 (FIG. 12).

Figure 14:
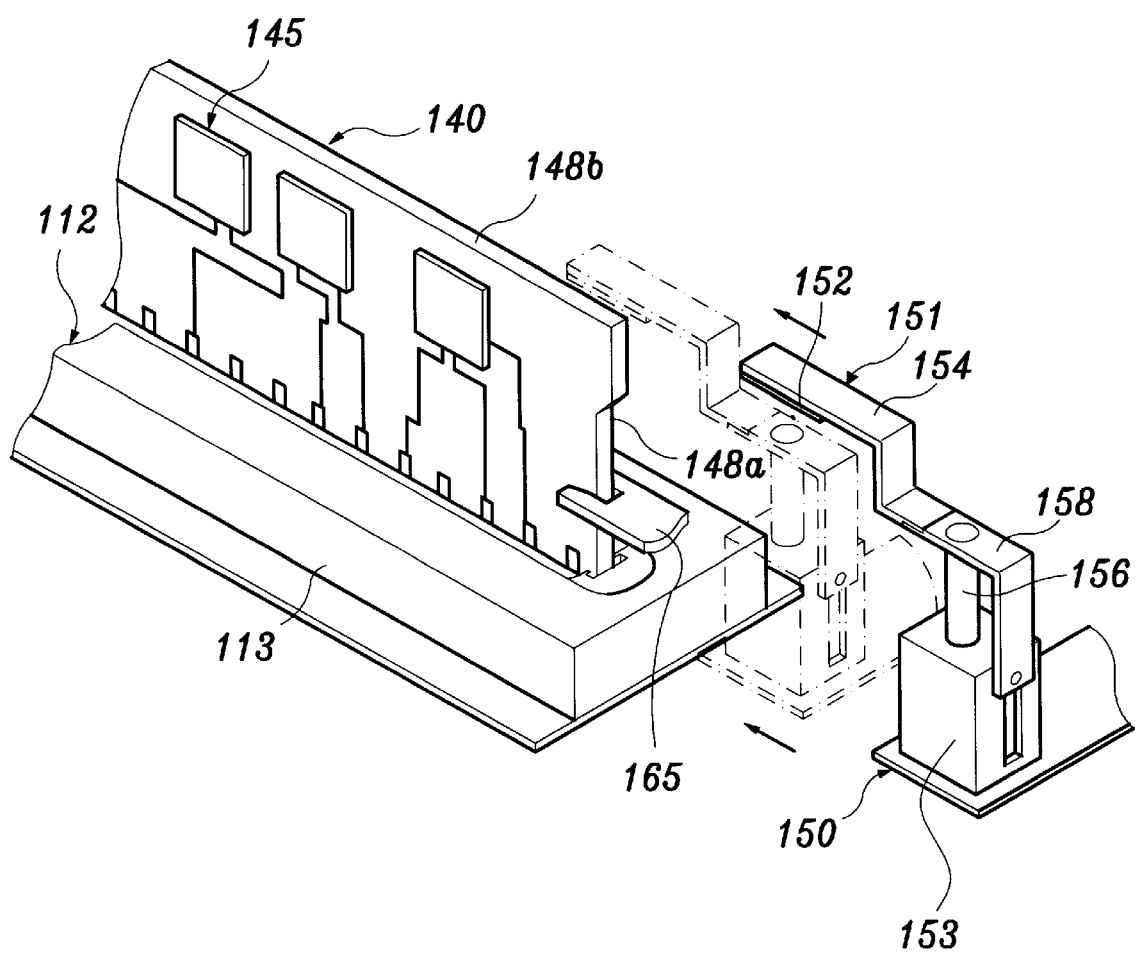
FIGS. 14 to 16 are perspective views showing the movement of an insertion part when a module is inserted to a socket.
Figure 15:
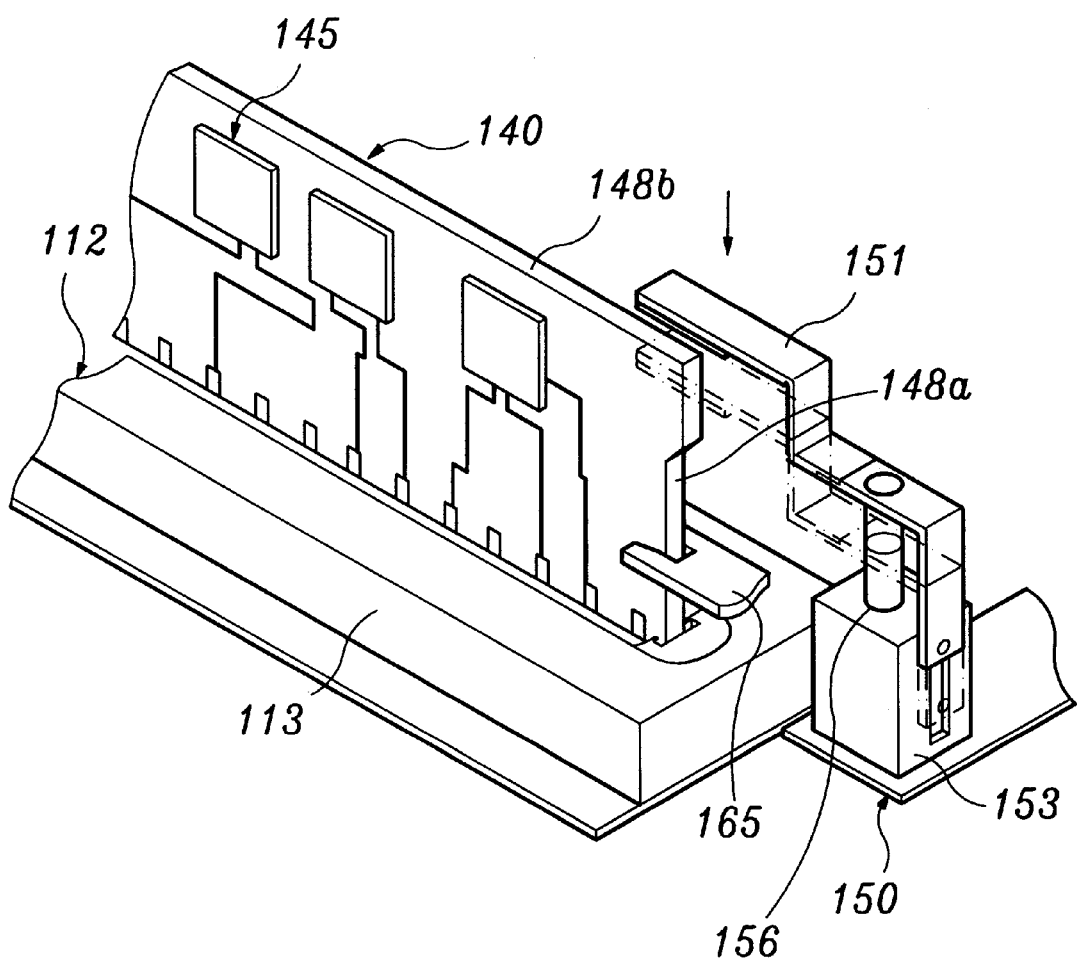
Figure 16:
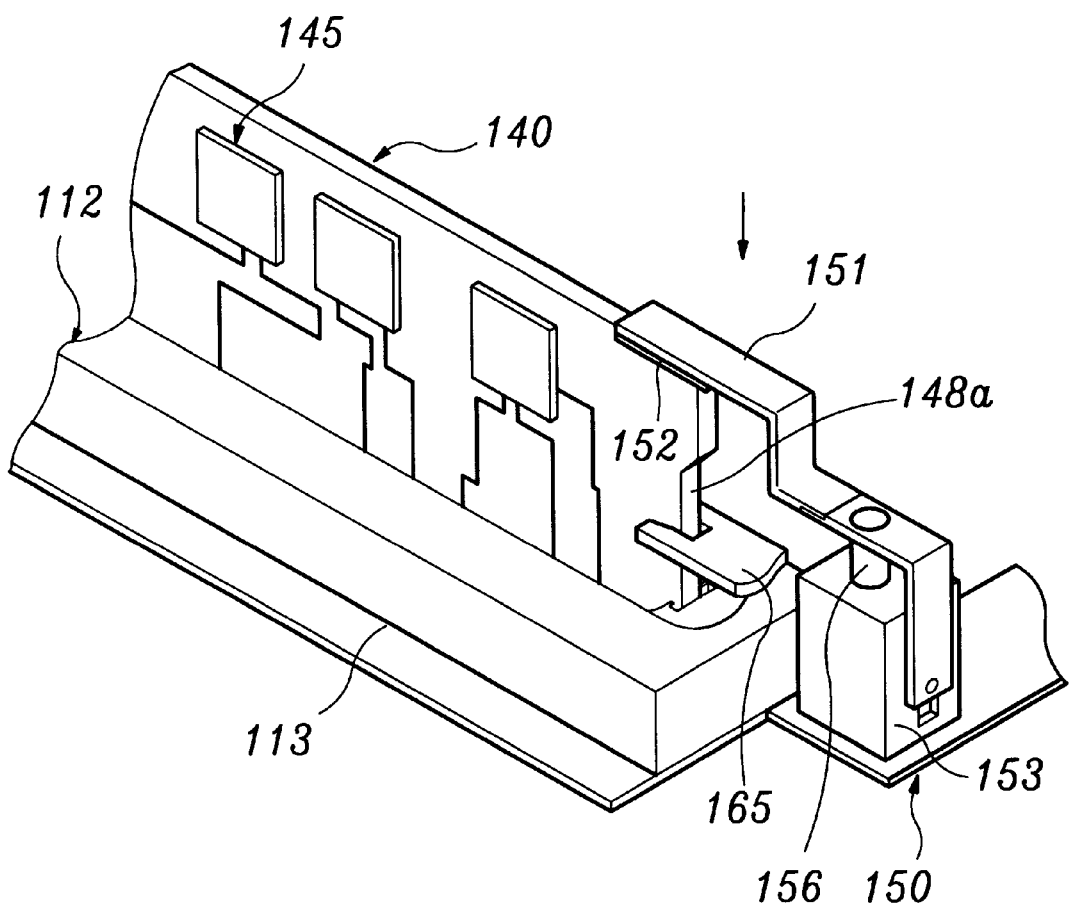

Insertion part 150 will be described with reference to FIGS. 7, 8 and 14. Insertion part 150 pushes module 140 aligned by alignment bar 165 downward to insert module 140 into socket slot 119. Insertion part 150 comprises an insertion base 157, a pressing cylinder 153, a pressing rod 156, and a pressing bar 151. Pressing bar 151 comprises a slide bar 158 fixed to the pressing rod 156 and a pressing block 154. Insertion base 157 moves along insertion base opening 159 of base block 116 (FIG. 7). Pressing cylinder 153 drives pressing rod 156 to move up and down, and moves pressing bar 151 up and down. Since pressing block 154 touches top edge 148b of module 140 when insertion part 150 presses down module 140, a buffering member 152, made of a resilient material such as rubber, is provided beneath pressing block 154 to protect top edge 148b of module 140 from damage. FIGS. 14 to 16 show the operation of insertion part 150 step by step. FIG. 14 shows insertion part 150 moving toward module 140, FIG. 15 shows pressing bar 151 pressing top edge 148b of module 140 down, and FIG. 16 shows completion of insertion of module 140 into slot 119 of socket 112.

Figure 10:
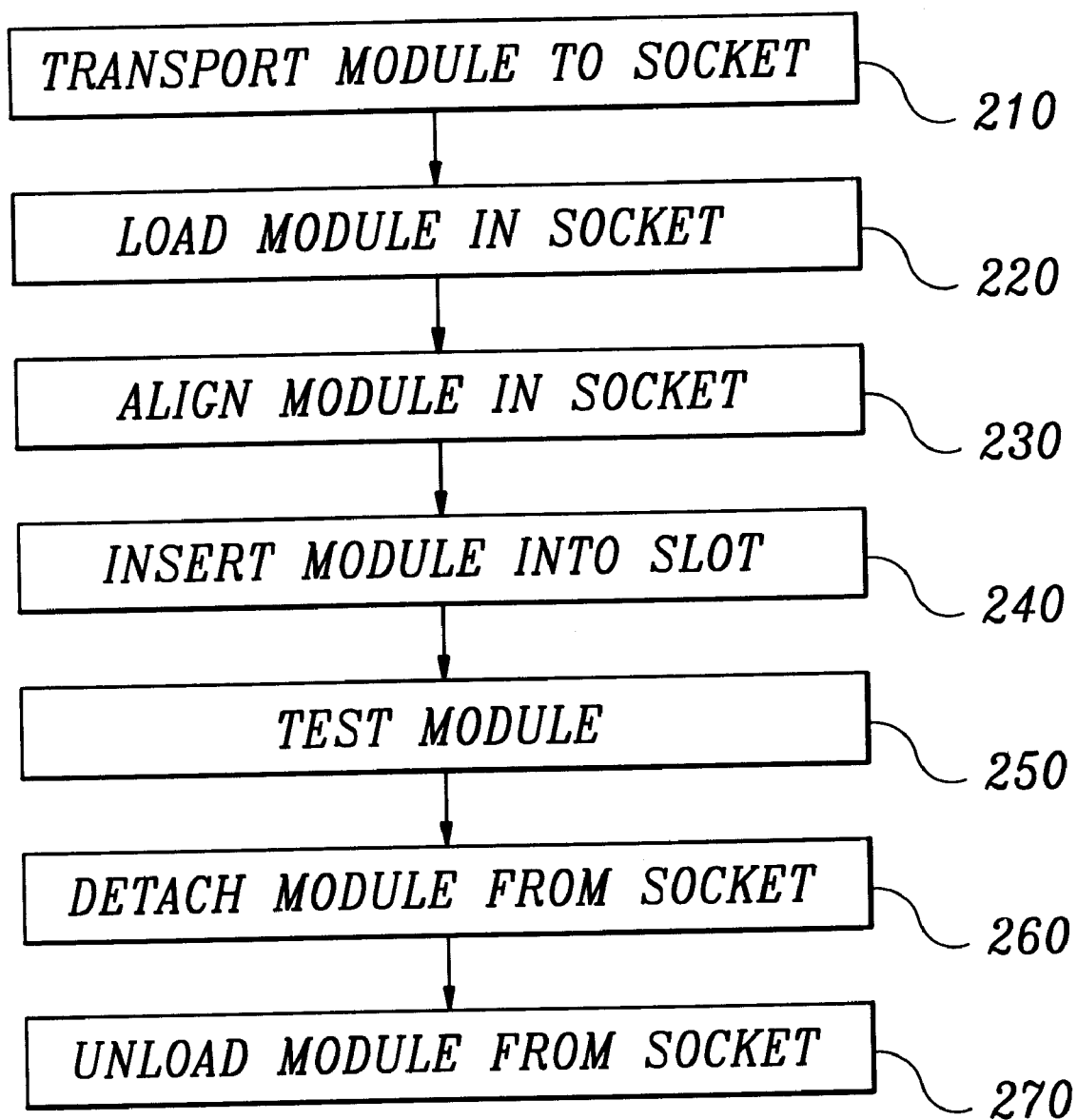
FIG. 10 is a flowchart of a module test procedure using a socket type module test apparatus.

Now a module test procedure using module test apparatus 200 will be explained with reference to FIGS. 10 to 23. FIG. 10 is a flowchart of the module test procedure.

First, loading picker 124 picks up module 140 in supply tray 132 and transports it to a position above a socket 112 [step 210], goes down toward socket 112, and releases module 140 so that the side edge of module 140 is supported by supporting part 146 and fits in insertion hole 117 [step 220]. Alignment bar 165 moves toward side edge 148a of module 140 and surrounds side edge 148a within recess 167 formed at the tip of alignment bar 165 to align module 140 with slot 119 [step 230].

Figure 17:
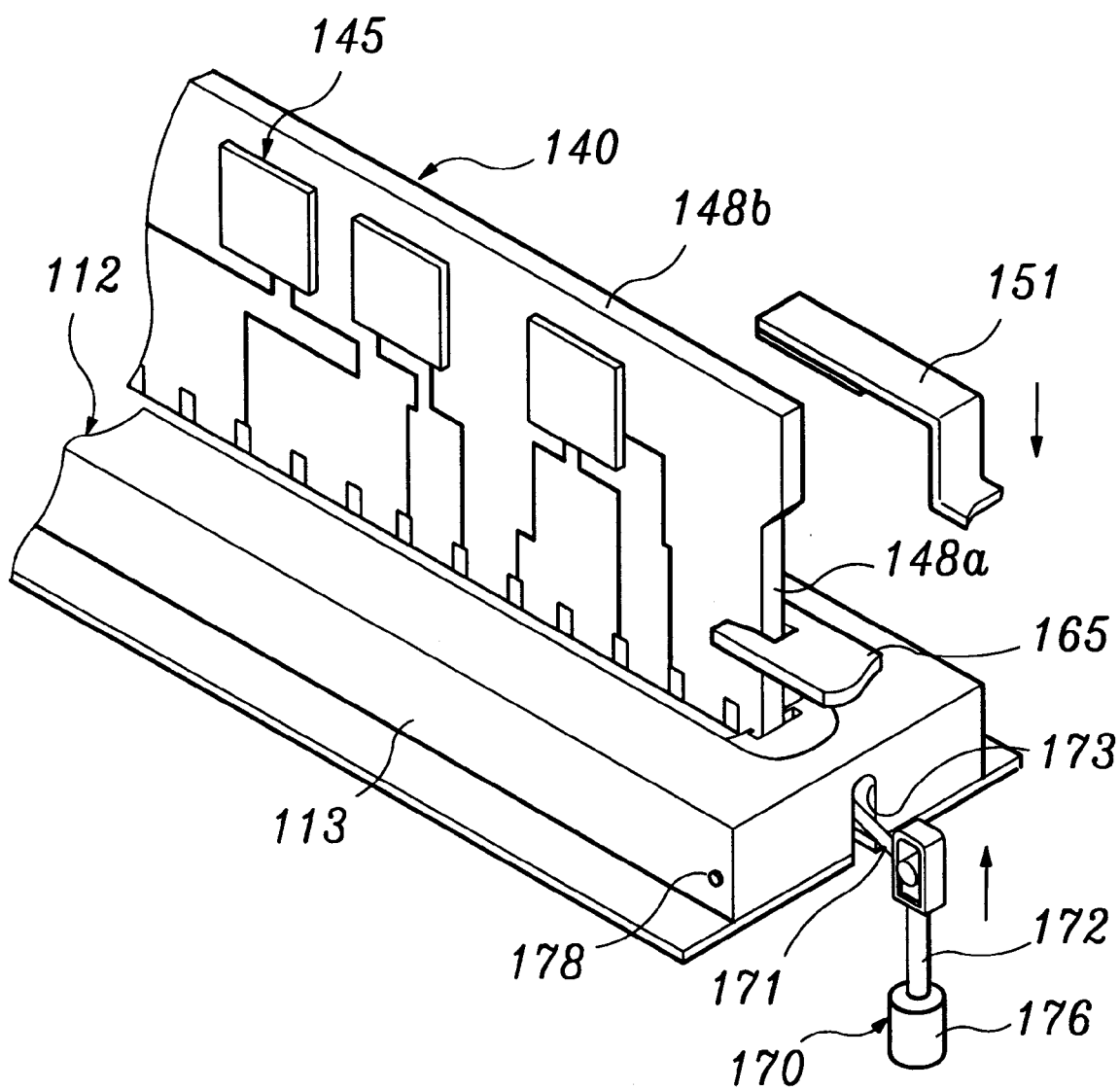
FIGS. 17 to 18 are perspective views showing the movement of a detaching part when a module is inserted to a socket.
Figure 18:
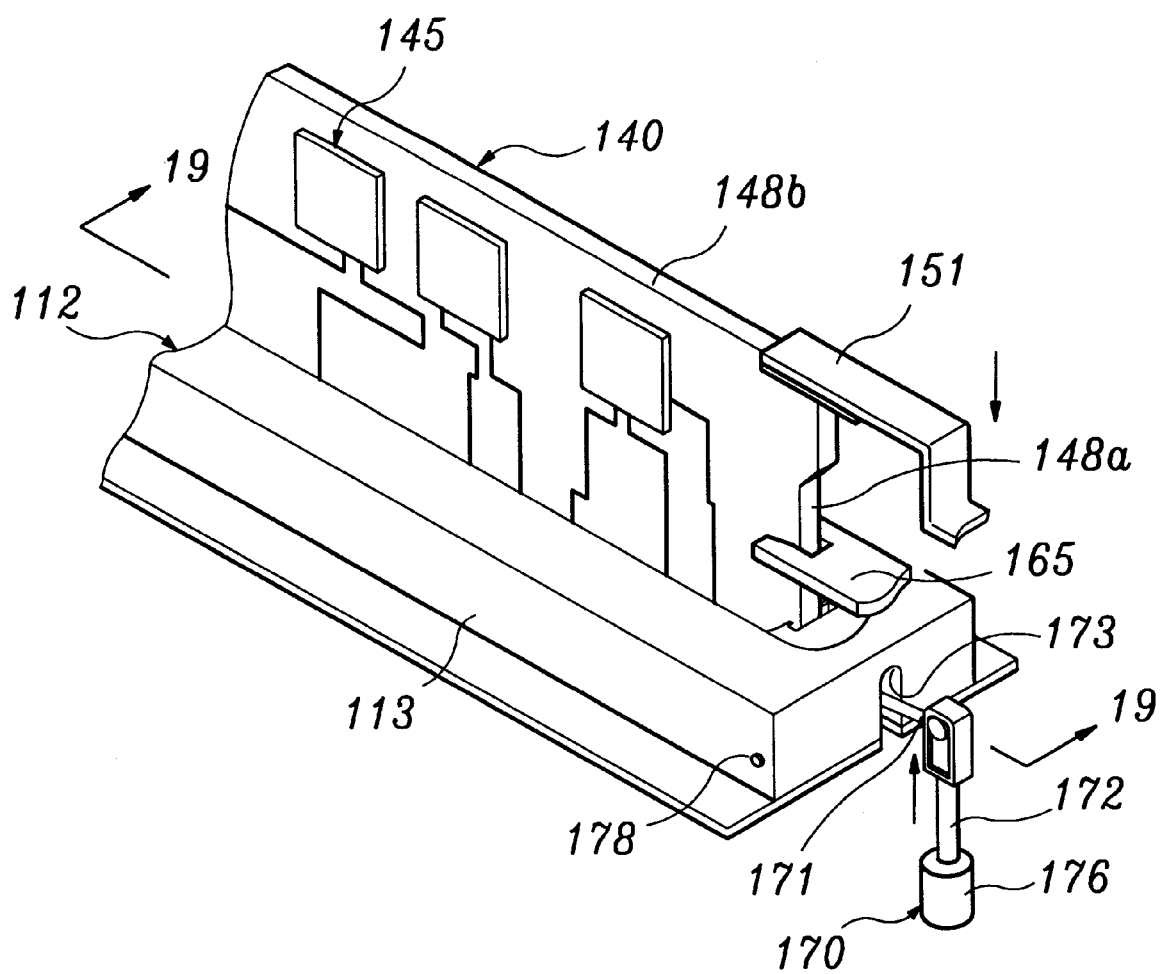
Figure 19:
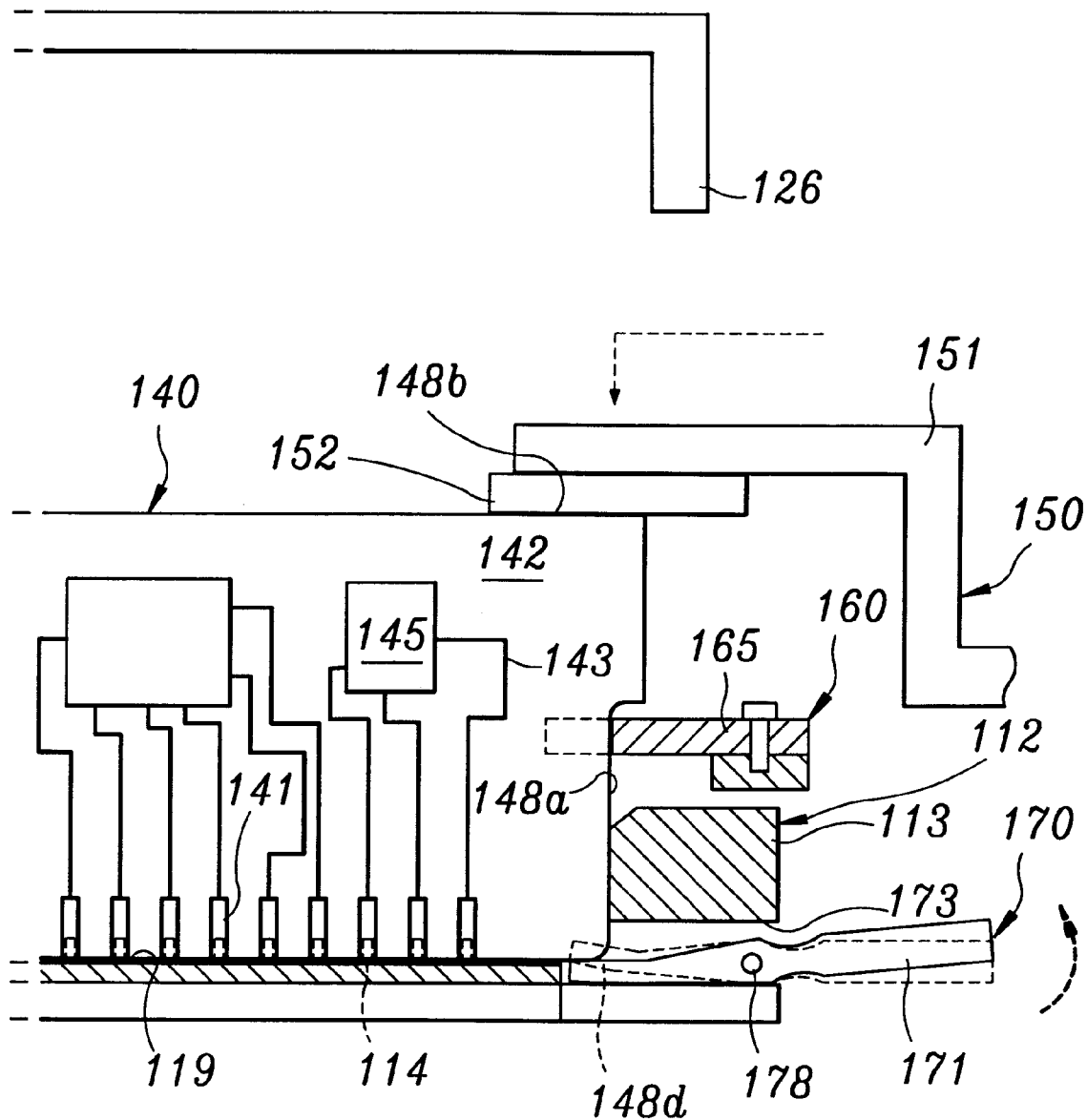
FIG. 19 is a sectional view taken along the line 19—19 in FIG. 18.

Next, insertion of module 140 to slot 119 [step 240] will be explained with reference to FIGS. 14 to 19. Insertion part 150 moves towards socket 112 so that pressing bar 151 is positioned over the top edge 148b of module 140 (FIG. 14). Then, as depicted in FIG. 15, pressing bar 151 goes down by the downward movement of pressing rod 156 and pushes module 140 into slot 119, so that external terminals 141 of module 140 contact socket contacts 114. FIGS. 17 to 19 show the movement of detaching part 170 in step 240. As shown in FIG. 19, bottom edge 148d of module 140 sits on the tip of detaching bar 171.

After the completion of insertion, the module test is performed by control unit 190 [step 250]. After the test begins, transportation unit 120 moves to supply tray 132, picks up new module 140 to be tested, moves back to above of sockets 112, and waits until the test ends. After the test is completed, tested module 140 is unloaded from socket 112 by detaching part 170 and unloading picker 126.

Figure 20:
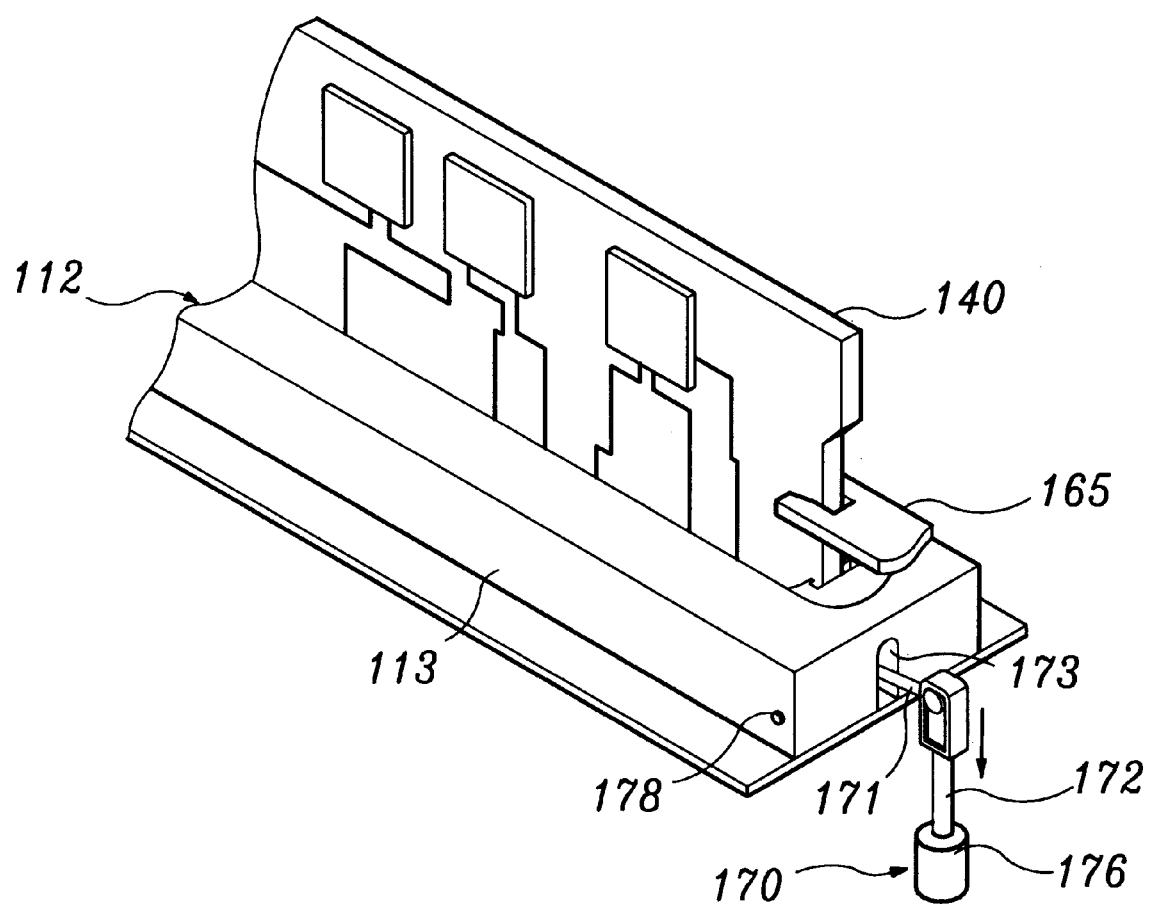
FIG. 20 and FIG. 21 are perspective views showing how a module is detached from a socket.
Figure 21:
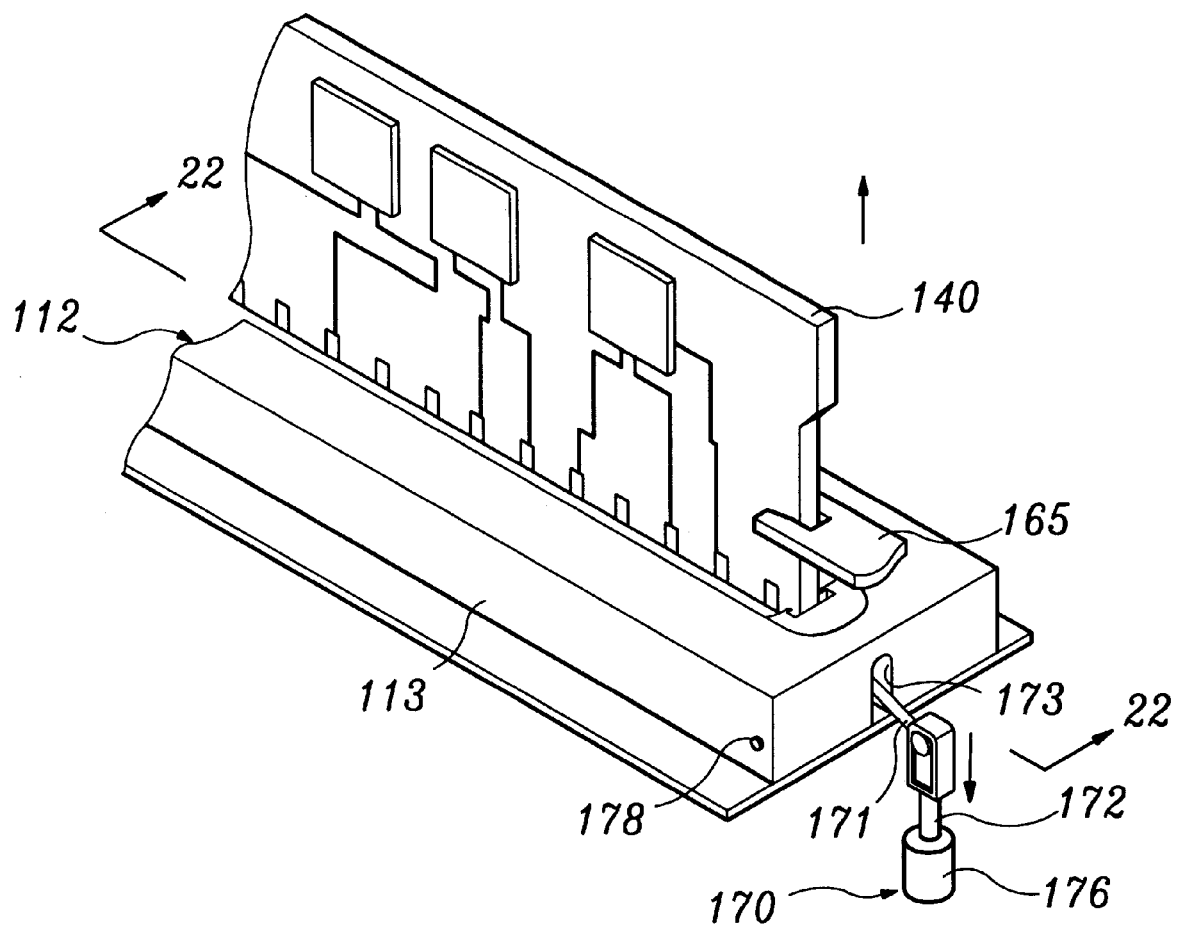
Figure 22:
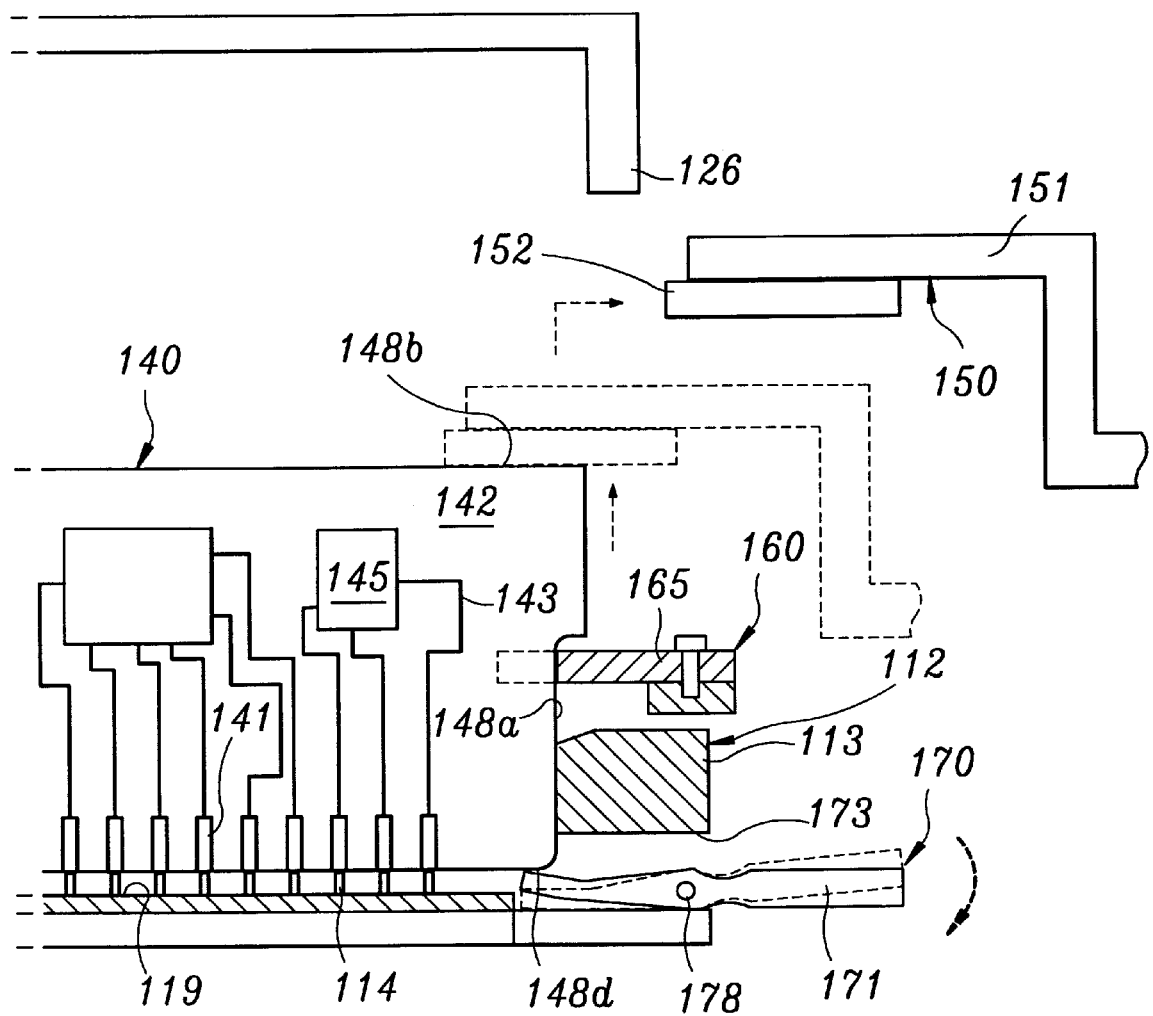
FIG. 22 is a sectional view taken along the line 22—22 in FIG. 21.

The step of detaching module 140, after test, from socket 112 [step 260] will be described with reference to FIGS. 20–22. Pressing bar 151 of insertion part 150 goes up and moves backward from module 140 (FIG. 22). Then, vertical cylinder 176 moves downward, so that detaching bar 171 rotates clockwise around fixing axle 178 and the tip of detaching bar 171 pushes up bottom edge 148d of module 140 from slot 119.

Figure 23:
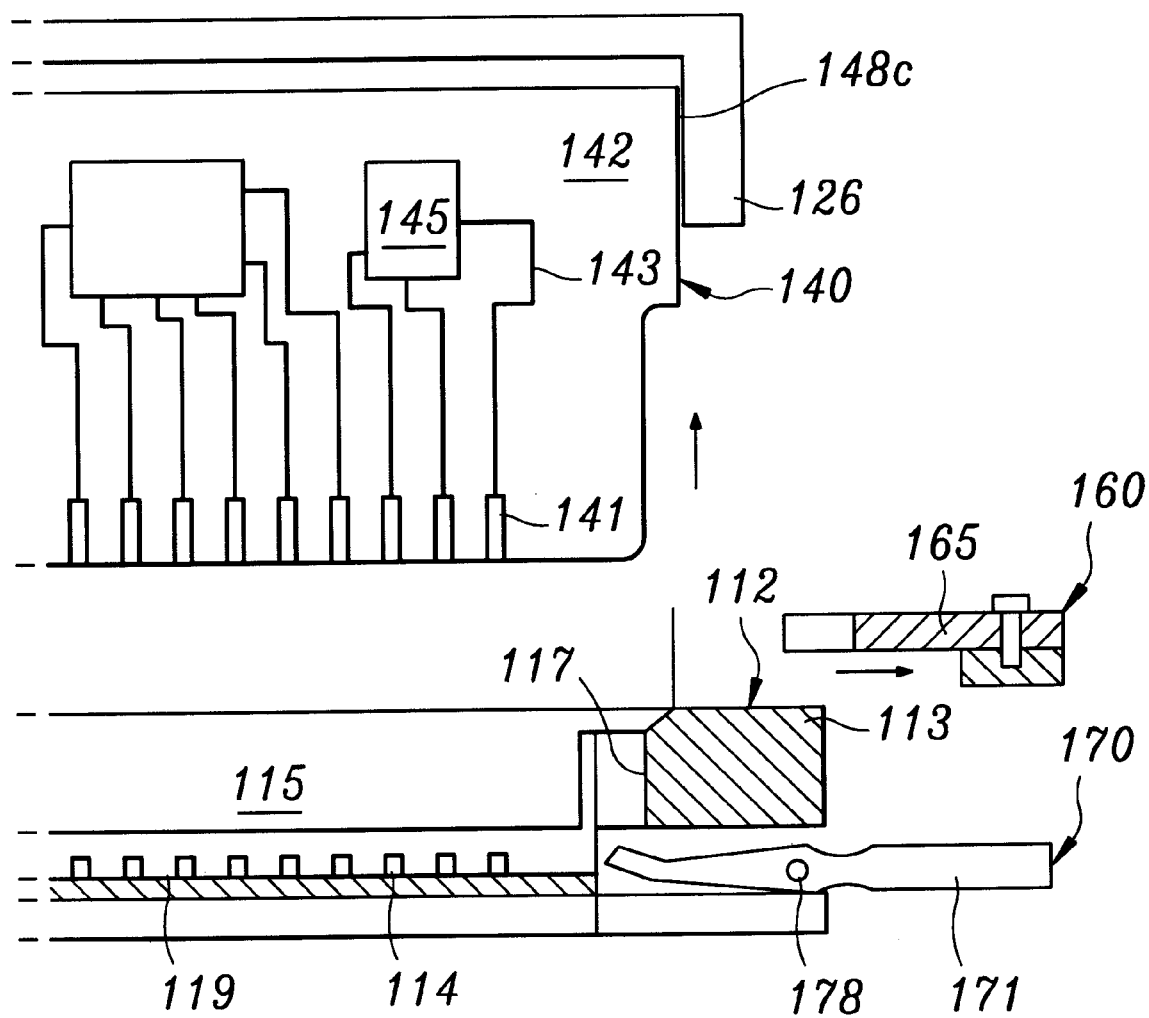
FIG. 23 is a sectional view showing how a detached module is being unloaded by an unloading picker.

Finally, the step of unloading module 140 from socket 112 [step 270] will be discussed with reference to FIGS. 6 and 23. Unloading picker 126 which had stayed over module 140 goes down and picks up side edge 148c of module 140. Alignment bar 165 moves back from module 140, and unloading picker 126 moves upward. Then, loading picker 124 having new module to be tested loads and inserts the module to socket 112, and test of the newly inserted module begins. During the test, transportation unit 120 moves, so that unloading picker 126 places module 140 to output tray 134 or collection bin 136, and loading picker 124 picks up another module to be tested. Transportation unit 120 moves back to test unit 110, and waits for the completion of the test.

The module test and sorting process is automatically performed by repeating the above processes. According to this invention, stable contact between module and test apparatus was achieved by using sockets, and high test productivity was achieved by employing the module transportation unit and the module insertion-detaching unit.

While this invention has been described with reference to an illustrative embodiment, this description is not intended to be construed in a limiting sense, and it will be appreciated that various modifications and alterations might be made by those skilled in the art without departing from the spirit and scope of the present invention.

What is claimed is:

1. A module test apparatus comprising:
   a transportation unit that transports a module;
   a test unit which comprises:
   a socket comprising a socket body, a slot to which the module is inserted, a pair of guide openings, which are formed on respective transverse sides of the socket body and extend to respective ends of the slot, and a plurality of socket contacts along inner walls of the slot for electrical connection to the module;
   a test board on which the socket is placed, the test board inputting and outputting test signals to the module through the socket contacts;
   a base block on which the test board is placed;
   an alignment part which is on the base block, the alignment part aligning and supporting the module when the transportation unit loads the module to the socket;
   an inserting part which is on the base block, the inserting part inserting and thus electrically connecting the module to the socket; and
   a detaching part which is on the base block, the detaching part detaching the module from the socket, wherein a portion of the detaching part extends from outside of socket to the slot through the guide opening; and
   a main control unit that supervises a test procedure by providing test signals to the module in the socket and making a judgment of whether the module passes the test.

2. The apparatus according to claim 1, wherein the detaching part comprises:
   a detaching bar which extends from outside of socket to the slot through the guide opening;
   a fixing axle which pivotally fixes the detaching bar; and
   a cylinder which drives the detaching bar to move, wherein the module sits on a tip of the detaching bar so that both ends of bottom edge of the module touch a top side of the detaching bar.

3. The apparatus according to claim 2, wherein the tip of the detaching bar touches an outer side bottom edge beyond an outermost contact of the socket.

4. The apparatus according to claim 1, wherein the insertion part comprises:
   an insertion base which is on the base block and moves forward and backward with respect to the socket,
   a pressing cylinder which is on the insertion base, the pressing cylinder having a vertical pressing rod, and
   a pressing bar which is on the vertical pressing rod, wherein the pressing bar moves down by descending the pressing rod and pushes the module into the slot.

5. The apparatus according to claim 4, wherein a buffering member is attached to the pressing bar where the pressing bar contacts the module.

6. The apparatus according to claim 1, wherein the alignment part comprises:
   an alignment base which is on the base block and moves forward and backward with respect to the socket,
   a connection bar which is on the alignment base, and
   an alignment bar which is connected to the connection bar, the alignment bar having a recess at the endmost part thereof, wherein the alignment bar moves forward and backward with respect to the socket, surrounds side edge of the module within the recess, and supports the module,
   wherein the connection bar transfers the movement of the alignment base to the alignment bar.

7. The apparatus according to claim 6, wherein the alignment bar is made of a polymeric material.

8. The apparatus according to claim 1, wherein the transportation unit comprises:
   a loading picker that loads the module to the socket, and
   an unloading picker that unloads the module from the socket.

9. The apparatus according to claim 1, wherein the socket further comprises a trench formed around a mouth of the slot for guiding the module into the slot.

10. The apparatus according to claim 9, wherein the detaching part comprises:
    a detaching bar which extends from outside of socket to the slot through the guide opening;
    a fixing axle which pivotally fixes the detaching bar; and
    a cylinder which drives the detaching bar to move, wherein the module sits on a tip of the detaching bar so that both ends of bottom edge of the module touch a top side of the detaching bar.

11. The apparatus according to claim 10, wherein the tip of the detaching bar touches an outer side bottom edge beyond an outermost contact of the socket.

12. The apparatus according to claim 9, wherein the insertion part comprises:
    an insertion base which is on the base block and moves forward and backward with respect to the socket,
    a pressing cylinder which is on the insertion base, the pressing cylinder having a vertical pressing rod, and
    a pressing bar which is on the vertical pressing rod, wherein the pressing bar moves down by descending the pressing rod and pushes the module into the slot.

13. The apparatus according to claim 12, wherein a buffering member is attached to the pressing bar where the pressing bar contacts the module.

14. The apparatus according to claim 9, wherein the alignment part comprises:
    an alignment base which is on the base block and moves forward and backward with respect to the socket,
    a connection bar which is on the alignment base, and
    an alignment bar which is connected to the connection bar, the alignment bar having a recess at the endmost part thereof, wherein the alignment bar moves forward and backward with respect to the socket, surrounds a side edge of the module within the recess, and supports the module,
    wherein the connection bar transfers the movement of the alignment base to alignment bars.

15. The apparatus according to claim 14, wherein the alignment bar is made of a polymeric material.

16. The apparatus according to claim 9, wherein the transportation unit comprises:
    a loading picker that loads the module to the socket, and
    an unloading picker that unloads the module from the socket.

17. The apparatus according to claim 9, wherein the socket further comprises a pair of insertion holes formed at the end of the trench in integration with the slot for aligning and guiding the module into the slot.

18. The apparatus according to claim 17, wherein the detaching part comprises:
   a detaching bar which extends from outside of socket to the slot through the guide opening;
   a fixing axle which pivotally fixes the detaching bar; and
   a cylinder which drives the detaching bar to move, wherein the module sits on a tip of the detaching bar so that both ends of bottom edge of the module touch top side of the detaching bar.

19. The apparatus according to claim 18, wherein the tip of the detaching bar touches an outer side bottom edge beyond an outermost contact of the socket.

20. The apparatus according to claim 17, wherein the insertion part comprises:
   an insertion base which is on the base block and moves forward and backward with respect to the socket,
   a pressing cylinder which is on the insertion base, the pressing cylinder having a vertical pressing rod, and
   a pressing bar which is placed on the vertical pressing rod, wherein the pressing bar moves down by descending the pressing rod and pushes the module into the slot.

21. The apparatus according to claim 20, wherein a buffering member is attached to the pressing bar where the pressing bar contacts the module.

22. The apparatus according to claim 17, wherein the alignment part comprises:
   an alignment base which is on the base block and moves forward and backward with respect to the socket,
   a connection bar which is on the alignment base, and
   an alignment bar which is connected to the connection bar, the alignment bar having a recess at the endmost part thereof, wherein the alignment bar moves forward and backward with respect to the socket, surrounds a side edge of the module within the recess, and supports the module,
   wherein the connection bar transfers the movement of the alignment base to alignment bars.

23. The apparatus according to claim 22, wherein the alignment bar is made of a polymeric material.

24. The apparatus according to claim 17, wherein the transportation unit comprises:
   a loading picker that loads the module to the socket, and
   an unloading picker that unloads the module from the socket.

* * * * *